US010438847B2

(12) United States Patent
Lai et al.

(10) Patent No.: US 10,438,847 B2
(45) Date of Patent: Oct. 8, 2019

(54) MANGANESE BARRIER AND ADHESION LAYERS FOR COBALT

(71) Applicant: Lam Research Corporation, Fremont, CA (US)

(72) Inventors: Chiukin Steven Lai, Sunnyvale, CA (US); Jeong-Seok Na, Fremont, CA (US); Raashina Humayun, Los Altos, CA (US); Michal Danek, Cupertino, CA (US); Kaihan Abidi Ashtiani, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 15 days.

(21) Appl. No.: 15/592,046

(22) Filed: May 10, 2017

(65) Prior Publication Data

US 2017/0330797 A1   Nov. 16, 2017

Related U.S. Application Data

(60) Provisional application No. 62/336,121, filed on May 13, 2016.

(51) Int. Cl.
*H01L 21/768* (2006.01)
*C23C 16/04* (2006.01)
(Continued)

(52) U.S. Cl.
CPC ...... *H01L 21/76879* (2013.01); *C23C 16/045* (2013.01); *C23C 16/18* (2013.01);
(Continued)

(58) Field of Classification Search
CPC ......... H01L 21/76879; H01L 21/76843; H01L 21/76831; H01L 21/76801;
(Continued)

(56) References Cited

U.S. PATENT DOCUMENTS 6,194,315 B1 * 2/2001 Hu ............... H01L 21/76843
257/E21.584
8,610,281 B1 * 12/2013 Nguyen ............ H01L 23/481
257/770
(Continued)

FOREIGN PATENT DOCUMENTS

CN      102224574 A    10/2011
WO   WO 2014/105477 A1   7/2014

OTHER PUBLICATIONS

Casey, Patrick, et al., "Synchrotron radiation photoemission study of in situ manganese silicate formation on SiO2 for barrier layer applications," *American Institute of Physics*, Applied Physics Letters 98, 2011, pp. 113508-1-113508-3.
(Continued)

*Primary Examiner* — Joseph C. Nicely
(74) *Attorney, Agent, or Firm* — Weaver Austin Villeneuve & Sampson LLP

(57) ABSTRACT

Provided herein are methods of forming conductive cobalt (Co) interconnects and Co features. The methods involve deposition of a thin manganese (Mn)-containing film on a dielectric followed by subsequent deposition of cobalt on the Mn-containing film. The Mn-containing film may be deposited on a silicon-containing dielectric, such as silicon dioxide, and annealed to form a manganese silicate.

13 Claims, 9 Drawing Sheets

(51) Int. Cl.
| | |
|---|---|
| *C23C 16/18* | (2006.01) |
| *C23C 16/452* | (2006.01) |
| *C23C 16/455* | (2006.01) |
| *C23C 16/505* | (2006.01) |
| *C23C 16/56* | (2006.01) |
| *H01L 21/285* | (2006.01) |
| *H01L 23/532* | (2006.01) |

(52) U.S. Cl.
CPC ...... *C23C 16/452* (2013.01); *C23C 16/45525* (2013.01); *C23C 16/505* (2013.01); *C23C 16/56* (2013.01); *H01L 21/28556* (2013.01); *H01L 21/76801* (2013.01); *H01L 21/76831* (2013.01); *H01L 21/76838* (2013.01); *H01L 21/76843* (2013.01); *H01L 21/76847* (2013.01); *H01L 21/76855* (2013.01); *H01L 21/76856* (2013.01); *H01L 21/76864* (2013.01); *H01L 21/76871* (2013.01); *H01L 23/53209* (2013.01); *H01L 21/76883* (2013.01)

(58) Field of Classification Search
CPC ......... H01L 21/76856; H01L 21/76855; H01L 21/76847; H01L 21/76864; H01L 21/76883; H01L 21/76838; H01L 23/53209
See application file for complete search history.

(56) References Cited

U.S. PATENT DOCUMENTS

| | | | | |
|---|---|---|---|---|
| 8,673,779 | B1* | 3/2014 | Yoon | H01L 21/76883 257/E21.575 |
| 9,349,637 | B2 | 5/2016 | Na et al. | |
| 9,362,228 | B2* | 6/2016 | Chae | H01L 23/5226 |
| 9,748,137 | B2 | 8/2017 | Lai et al. | |
| 9,997,362 | B2* | 6/2018 | Baum | H01L 21/28556 |
| 10,128,151 | B2* | 11/2018 | Kamineni | H01L 21/76883 |
| 2007/0166989 | A1 | 7/2007 | Fresco et al. | |
| 2009/0053426 | A1 | 2/2009 | Lu et al. | |
| 2010/0227473 | A1* | 9/2010 | Matsuda | H01L 21/02063 438/653 |
| 2013/0260555 | A1 | 10/2013 | Zope et al. | |
| 2014/0097538 | A1* | 4/2014 | Zhao | H01L 23/53238 257/751 |
| 2014/0106083 | A1 | 4/2014 | Wu et al. | |
| 2014/0332961 | A1* | 11/2014 | Lee | B32B 15/01 257/751 |
| 2015/0108646 | A1* | 4/2015 | Chae | H01L 23/5226 257/751 |
| 2015/0108647 | A1* | 4/2015 | Zhang | H01L 21/76858 257/751 |
| 2015/0137373 | A1* | 5/2015 | Zhang | H01L 21/76846 257/751 |
| 2015/0179579 | A1* | 6/2015 | Jezewski | H01L 21/76846 257/753 |
| 2015/0228585 | A1* | 8/2015 | He | H01L 23/53238 257/751 |
| 2015/0270133 | A1* | 9/2015 | Lam | H01L 21/2885 205/157 |
| 2016/0017482 | A1* | 1/2016 | Trivedi | C23C 16/045 427/250 |
| 2016/0056074 | A1 | 2/2016 | Na et al. | |
| 2016/0056077 | A1 | 2/2016 | Lai et al. | |
| 2017/0040213 | A1* | 2/2017 | Bruce | H01L 23/5226 |
| 2017/0053876 | A1* | 2/2017 | Wu | H01L 23/53266 |
| 2017/0077037 | A1* | 3/2017 | Kelly | H01L 23/53238 |
| 2017/0084483 | A1* | 3/2017 | Yang | H01L 21/76864 |
| 2017/0092536 | A1* | 3/2017 | Yang | H01L 21/76855 |
| 2017/0133325 | A1* | 5/2017 | Chae | H01L 21/76879 |
| 2017/0236781 | A1* | 8/2017 | Briggs | H01L 23/535 257/751 |

OTHER PUBLICATIONS

Kurokawa, Atsuko, et al., "Simultaneous Formation of a Metallic Mn Layer and a MnOx/MnSixOy Barrier Layer by Chemical Vapor Deposition at 250° C.," *Japanese Journal of Applied Physics 52*, 2013, pp. 05FA02-1-05FA02-3.
Strem Chemicals, Inc., "Bis(N,N'-di-i-propylpentylamidinato)manganese(II), min. 98%," Catalog #25-0230, retrieved from www.strem.com on May 9, 2017, 1 page.
Strem Chemicals, Inc., "Bis(N,N'-di-i-propylpentylamidinato)manganese, Safety Data Sheet according to OSHA HCS," Printing date Sep. 16, 2015, 8 pages.
Gordon, Roy G., "Vapor Deposition of Materials for Nano-Electronics," Department of Chemistry and Chemical Biology and School of Engineering and Applied Sciences Director, Center for Nanoscale Systems, Harvard University, 58 pages.
Gordon, Roy G., "Chemical Vapor Deposition (CVD) of Manganese Self-Aligned Diffusion Barriers for Cu Interconnections in Microelectronics," Digital Access to Scholarship at Harvard, Advanced Metallization Conference 2008, 10 pages.
Hausmann, Dennis, et al., "Rapid Vapor Deposition of Highly Conformal Silica Nanolaminates," *Science*, Reports, Oct. 2002, vol. 298, pp. 402-406.
Au, Yeung, et al., "Selective Chemical Vapor Deposition of Manganese Self-Aligned Capping Layer for Cu Interconnections in Microelectronics," *Journal of the Electrochemical Society*, vol. 157, No. 6, 2010, pp. D341-D345.
Au, Yeung, et al., "Filling Narrow Trenches by Iodine-Catalyzed CVD of Copper and Manganese on Manganese Nitride Barrier/Adhesion Layers," *Journal of the Electrochemical Society*, 2011, vol. 158, No. 5, pp. D248-D253.
Ishida, K., et al., "The Co—Mn (Cobalt-Manganese) System," *Bulletin of Alloy Phase Diagrams*, vol. 11, No. 2, 1990, pp. 125-137.
Hesemann, H., et al., "The Effect of Film Thickness on Stress and Transformation Behavior in Cobalt Thin Films," *Mat. Res. Soc. Symp. Proc.*, vol. 594, 2000, Materials Research Society, pp. 219-224.
U.S. Office Action dated Sep. 3, 2015 issued in U.S. Appl. No. 14/465,610.
U.S. Notice of Allowance dated Jan. 14, 2016 issued in U.S. Appl. No. 14/465,610.
U.S. Office Action dated Nov. 1, 2016 issued in U.S. Appl. No. 14/873,152.
U.S. Notice of Allowance dated Apr. 27, 2017 issued in U.S. Appl. No. 14/873,152.
Chinese First Office Action dated Dec. 12, 2017 issued in Application No. CN 201510518752.1.
Chinese Second Office Action dated Aug. 24, 2018 issued in Application No. CN 201510518752.1.

* cited by examiner

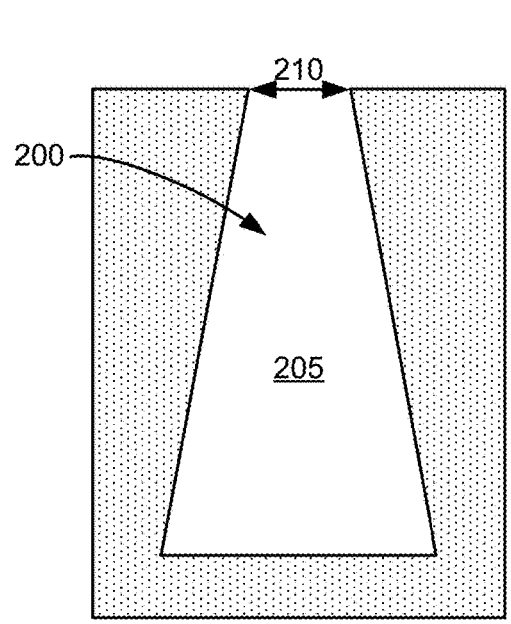
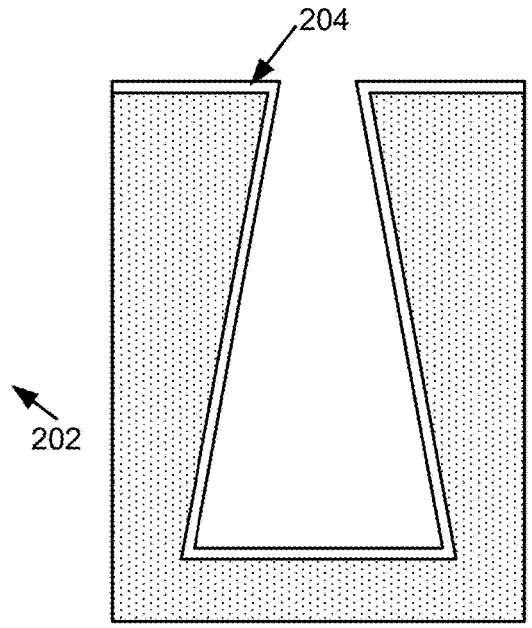
FIG. 2A  FIG. 2B
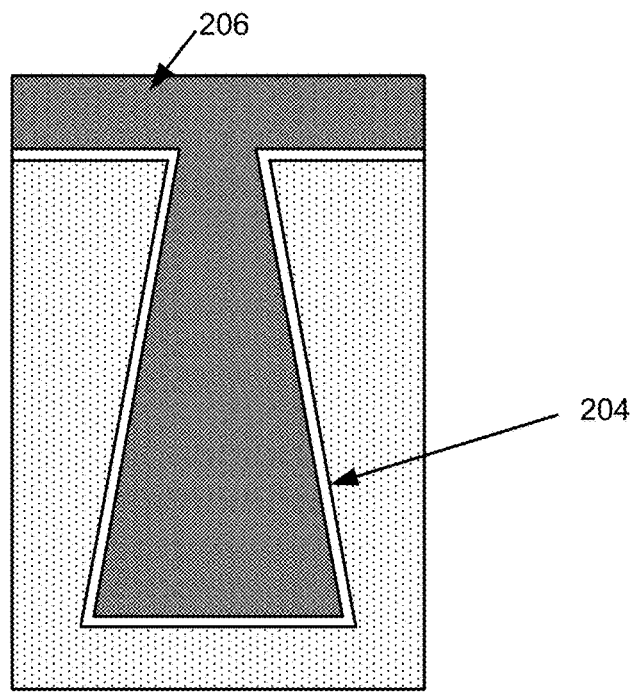
FIG. 2C

MANGANESE BARRIER AND ADHESION LAYERS FOR COBALT

CROSS-REFERENCE TO RELATED APPLICATION

This application claims priority under 35 U.S.C. § 119 to U.S. Provisional Patent Application No. 62/336,121, filed May 13, 2016 and titled "Manganese Barrier And Adhesion Layers For Cobalt," which is incorporated by reference herein in its entirety.

BACKGROUND

Semiconductor device fabrication often involves deposition of conductive materials for front end of line (FEOL), middle of line (MOL) and back end of line (BEOL) applications such as source and drain contacts and logic interconnects. For example, tungsten-containing materials may be used for horizontal interconnects, vias between adjacent metal layers, and contacts between first metal layers and devices on the silicon substrate. Copper is another commonly used conductive material. However, as devices shrink, features become narrower and aspect ratios increase, resulting in challenges in employing these conductive materials.

For example, copper interconnects are challenging to fabricate beyond the 7 nm technology node. Deposition of copper interconnects often involves first depositing a barrier layer. A copper barrier material that maintains its integrity as thickness is scaled below 2.5 nm has not been identified. As the linewidth scales to 10 nm (at the 5 nm technology node), the barrier will consume 5 nm of the linewidth and more than 50% of the line cross-section, increasing the resistance exponentially with each technology node beyond 10 nm. As a result, alternative materials are sought to fill features.

One alternative to copper and tungsten is cobalt. However, there are various process integration challenges for applications such as cobalt interconnects.

SUMMARY

One aspect of the disclosure relates to a method including (a) providing a substrate having a feature comprising a feature opening; (b) forming a manganese-containing liner layer in the feature; and (c) after (b), exposing the substrate to a cobalt-containing precursor to at least partially fill the feature with cobalt. In some embodiments, (c) comprises wholly filling the feature with cobalt.

In some embodiments, the method further includes heating the substrate to a temperature of at least 400° C. to anneal the cobalt. In some such embodiments, the method further includes reacting at least some manganese with cobalt during the heating of the substrate.

In some embodiments, (b) comprises atomic layer deposition (ALD) or chemical vapor deposition (CVD) of an elemental manganese film in the feature. In some such embodiments, (b) further includes heating the substrate to at least 350° C. to allow the elemental manganese film to react with a silicon-containing underlayer to form a layer of manganese silicate. In some such embodiments, an exposed portion of the elemental manganese film is not converted to manganese silicate.

In some embodiments, (b) includes atomic layer deposition (ALD) or chemical vapor deposition (CVD) of a manganese nitride film in the feature. In some such embodiments, the method further includes heating the substrate to at least 350° C. to allow manganese to react with a silicon-containing underlayer to form a layer of manganese silicate and to desorb nitrogen from the substrate.

In some embodiments, the method further includes, after (b) and before (c), exposing the substrate to nitrogen species to form a differential inhibition profile. In some such embodiments, the method further includes preferentially depositing cobalt in the one or more features in accordance with the differential inhibition profile.

In some embodiments, (c) comprises depositing a cobalt seed layer for a subsequent Co plating process.

Another aspect of the disclosure relates to a method including including: (a) providing a substrate having a feature comprising a feature opening and having a dielectric silicon-containing sidewall; (b) forming an elemental manganese layer in the feature, wherein the elemental manganese layer is conformal to the feature; (c) after (b), converting a portion of the elemental manganese layer to a manganese silicate layer, allowing an exposed portion of the elemental manganese layer to remain unconverted; (d) filling the feature with cobalt; and (e) forming a cobalt-manganese alloy at the interface of cobalt and the manganese silicate layer.

These and other aspects are discussed further below with reference to the Figures.

BRIEF DESCRIPTION OF DRAWINGS

FIGS. 2A-2C are schematic cross-section diagrams illustrating certain operations in an example of the methods described with reference to FIG. 1.

FIG. 3 with anneal, FIG. 4 without anneal, and FIG. 5 without degas, $H_2$ plasma, or anneal.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor fabrication, features may be filled with conductive materials. For example, tungsten is often filled in features to form contacts, such as in front end of line (FEOL) applications. However, as devices shrink, aspect ratios increase and smaller features are used to form contacts. In many applications, an alternative conductive material, such as cobalt, may be used to form contacts or otherwise fill features.

Conventional cobalt deposition in semiconductor fabrication includes wet deposition processes such as electroplating and electroless plating. In cobalt electroplating, some thickness of the metal is first deposited in the feature such that the metal is sufficiently conductive, which permits a current to allow growth of the metal in the feature in the electroplating or electroless plating process. Such seed layers may have a certain maximum resistance. Wet-based cobalt feature fill processes such as electroplating typically involve feature fill in a different tool than the deposition of the seed layer, increasing the complexity of the process and the manufacturing cost.

Figure 1:
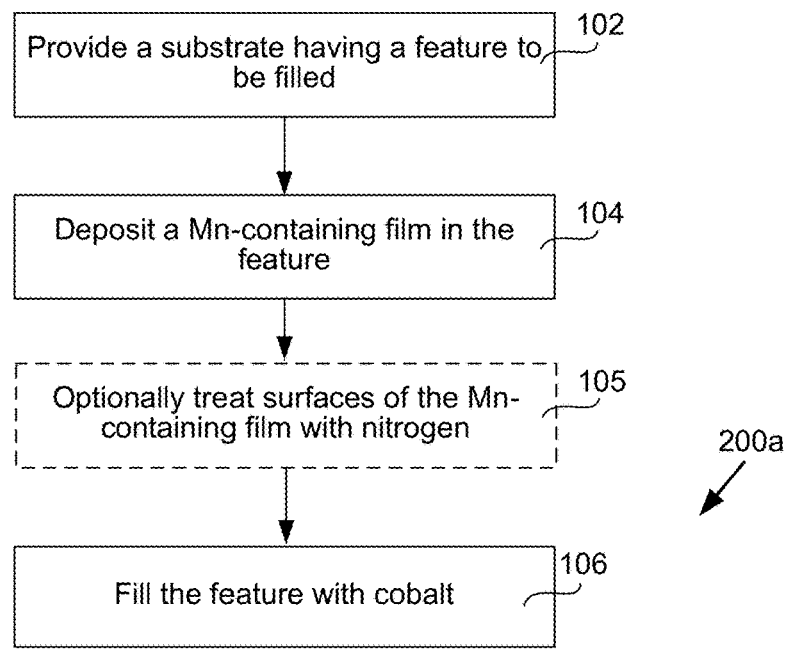
FIG. 1 is a process flow diagram of operations for performing methods in accordance with disclosed embodiments.

One aspect of the subject matter described herein relates to methods of forming conductive cobalt (Co) interconnects and other features. The methods involve deposition of a thin manganese (Mn)-containing film on a dielectric followed by subsequent deposition of cobalt on the Mn-containing film. FIG. 1 is a process flow diagram of operations for performing methods in accordance with disclosed embodiments. FIG. 2A-2C are schematic cross-section diagrams illustrating certain operations in an example of the methods described with reference to FIG. 1. In operation 102, a substrate having a feature to be filled is provided. The substrate may be a silicon substrate or another suitable semiconductor substrate. The feature may be in a semiconductor layer, insulator layer or conductive layer. The substrate may include more than one feature, and may include a pattern of features having features of various sizes, or features of one size. For purposes of this description, FIG. 1 is discussed in the context of filling a single feature, but it should be understood that features of various sizes may also be filled similarly.

FIG. 2A is a schematic illustration of an example of such a feature 200 in a substrate 202. The substrate may be a silicon wafer, e.g., a 200-mm wafer, a 300-mm wafer, or a 450-mm wafer, including wafers having one or more layers of material such as dielectric, conducting, or semi-conducting material deposited thereon. Features can be characterized by one or more of narrow and/or re-entrant openings, constrictions within the feature, and high aspect ratios. In some embodiments, the feature 200 may have an aspect ratio of at least about 2:1, at least about 10:1, at least about 15:1, at least about 20:1 or higher. A feature hole 205 represents the open space to be filled and may also have a dimension near the opening, e.g., an opening diameter or line width, or opening width, or critical dimension, of less than about 19 nm, also known as feature widths less than 1× nm. The feature 200 can be referred to as an unfilled feature or simply a feature. The feature, and any feature, may be characterized in part by an axis that extends through the length of the feature, with vertically-oriented features having vertical axes and horizontally-oriented features having horizontal axes. The feature may be characterized by a bottom that is a silicon, metal, or other material and dielectric sidewalls.

As shown, the substrate 202 includes a feature 200 having a feature opening 210 that is narrower than the width of the bottom of the feature. Thus, the feature 200 in FIG. 2A includes a re-entrant profile. A re-entrant profile is a profile that narrows from a bottom, closed end, or interior of the feature to the feature opening. According to various embodiments, the profile may narrow gradually and/or include an overhang at the feature opening. The re-entrant pattern shown in FIG. 2A may be generated by asymmetric etching kinetics during patterning and/or the overhang due to non-conformal film step coverage in the previous film deposition. In various examples, the feature may have a width smaller in the opening at the top of the feature than the width of the bottom of the feature.

Returning to FIG. 1, in operation 104, a Mn-containing film is formed in the feature. According to various embodiments, the Mn-containing film may be a thin layer that conforms to feature. FIG. 2B is a schematic illustration of a Mn-containing layer 204 deposited conformally into the feature 200. Mn deposition can be performed by an ALD or CVD process by reacting a Mn metal-organic precursor with a reducing agent such as $H_2$ or $NH_3$. Examples of Mn precursors include manganese(II) bis(N,N'-di-tert-butylacetamidinate), bis[1-(tert-butylamide)-2-dimethylaminoethane-N,N]manganese(II), and manganese(II) bis(N,N'-diisopropylpentamidinate).

In a CVD method, the substrate is exposed to a suitable Mn-containing precursor and a reducing agent to form a Mn layer on the substrate. In an ALD method, the substrate may be exposed in cycles such that the substrate is first exposed to a pulse of a suitable Mn-containing precursor, then the precursor is purged, then the substrate is exposed to a pulse of a reducing agent, and then the reducing agent is purged, and such cycles may be repeated until a desired thickness of Mn is formed on the substrate. An ALD method may be used for high aspect ratio and/or narrow features to facilitate conformal deposition. In some embodiments, a deposition temperature may be 250° C. or less.

In some embodiments, after ALD or CVD deposition of elemental Mn, an anneal treatment is performed to form a layer of manganese silicate, and is some cases, manganese oxide. For example, an anneal treatment of between about 350° C. and 500° C. may be performed. This Mn anneal may be performed after the deposition of the Mn layer or during a later Co anneal. In some embodiments, a deposition temperature may be high enough that a manganese silicate is formed during deposition and the additional anneal is not performed.

A Mn-containing film may be formed in a feature that has dielectric (e.g., $SiO_2$) sidewalls. In some embodiments, $MnO_x$ and/or $MnSi_yO_z$ (x, y, and z being any integer or non-integer number greater than zero that can be formed) will form on the top of a $SiO_2$ surface by Mn reduction of $SiO_2$. The Mn-containing film may be deposited to a thickness of less than 20 Å, and less than 10 Å, in some embodiments. As described below, because of its unique properties, even a thin layer of Mn can provide good adhesion and barrier properties for Co. The Mn-containing film may include elemental Mn as well as binary or ternary compounds such as $MnO_x$ and $MnSi_yO_z$. $MnO_x$ is used to denote a manganese oxide or mixture of manganese oxides. Mn(II) forms MnO; Mn(III) forms $Mn_2O_3$ which may be expressed as $MnO_{1.5}$, Mn(IV) forms $MnO_3$, etc. A layer of manganese oxide refers to a layer including a manganese oxide or mixture of multiple oxides. $MnSi_yO_z$ is used to denote a manganese silicate or mixture of manganese silicates. Mn(II) forms $MnSiO_3$. A layer of manganese silicate refers to a layer including manganese silicate or a mixture of multiple manganese silicates.

In some embodiments, the deposition and/or subsequent anneal is controlled such that a small amount (e.g., 2 to 3 monolayers) of unconverted pure Mn remains on top of the $MnSi_xO_y$. This unconverted Mn can alloy with Co and act as an adhesion layer.

In operation 105, the Mn-containing film is optionally treated with nitrogen. This operation is discussed further below, and may be done to inhibit Co nucleation at the top of the feature. As such, the treatment may be preferentially applied to the top of the feature.

In operation 106, the feature is filled with Co by one or more PVD, ALD, CVD, or plating processes. For example, in some embodiments, a thin seed layer of Co may be deposited by ALD. The seed layer may then be filled with bulk Co by CVD. Alternatively, Co may be plated on the Co seed layer. FIG. 2C shows an example of a feature including a Mn liner layer 204 that is filled with Co 206.

In a CVD method, the substrate is exposed to a suitable cobalt-containing precursor and a reducing agent to form a cobalt layer on the substrate. In some embodiments, the temperature may be between about 70° C. and about 400° C., or between about 80° C. and about 200° C. In some embodiments, the temperature may be between about 70° C. and about 200° C., or between about 100° C. and about 120° C. The chamber pressure may be about 0.1 Torr to about 10 Torr, or between about 1 Torr and about 30 Torr. In some embodiments, the chamber pressure may be between about 0.5 Torr and about 10 Torr, or between about 1 Torr and about 3 Torr. In various embodiments, the suitable cobalt-containing precursor and/or reducing agent are introduced into the chamber using a carrier gas, such as argon (Ar), nitrogen ($N_2$), or carbon monoxide (CO). In some embodiments, the cobalt-containing precursor is introduced to the chamber using argon as a carrier gas. The flow rate of the carrier gas may be between about 10 sccm and about 300 sccm, or between about 10 sccm and about 50 sccm. In some embodiments, the flow rate of the carrier gas may be between about 10 sccm and about 100 sccm, or between about 10 sccm and about 30 sccm. The reducing agent may be any suitable reactant for reducing the selected cobalt-containing precursor. In various embodiments, the reducing agent is hydrogen ($H_2$). In some embodiments, the reducing agent is ammonia ($NH_3$). The reducing agent may be introduced at a flow rate between about 100 sccm and about 5000 sccm, or between about 2000 sccm and about 5000 sccm. It will be understood that, depending on the particular deposition chamber, flow rates outside of the ranges provided throughout this disclosure may be used.

In an ALD method, the substrate may be exposed in cycles such that the substrate is first exposed to a pulse of a suitable cobalt-containing precursor, then the precursor is purged, then the substrate is exposed to a pulse of a reducing agent, and then the reducing agent is purged, and such cycles may be repeated until a desired thickness of cobalt is formed on the substrate. For a deposition process by ALD, the temperature may be between about 70° C. and about 400° C., or between about 100° C. and about 200° C. In some embodiments, the temperature may be between about 70° C. and about 200° C., or between about 100° C. and about 120° C. The pressure may be between about 1 Torr and about 30 Torr, or between about 8 Torr and about 15 Torr. In various embodiments, the cobalt-containing precursor and/or reducing agent are introduced into the chamber using a carrier gas, such as Ar, $N_2$, or CO. In some embodiments, the cobalt-containing precursor is introduced to the chamber using Ar as a carrier gas. The flow rate of the carrier gas may be between about 10 sccm and about 300 sccm, or between about 10 sccm and about 100 sccm. In some embodiments, the flow rate of the carrier gas may be between about 50 sccm and about 100 sccm. The reducing agent may be any suitable reactant for reducing the selected cobalt-containing precursor. In various embodiments, the reducing agent is $H_2$. The reducing agent may be introduced at a flow rate between about 100 sccm and about 5000 sccm, or between about 2000 sccm and about 5000 sccm. The time when operation 206 is terminated depends on the size of the feature.

Example cobalt-containing precursors include dicarbonyl cyclopentadienyl cobalt (I), cobalt carbonyl, various cobalt amidinate precursors, cobalt diazadienyl complexes, cobalt amidinate/guanidinate precursors, and combinations thereof. Suitable cobalt-containing precursors may include a cobalt center with organic groups and/or carbonyl groups, where organic groups include alkyls, such as methyl, ethyl, propyl, butyl, pentyl, hexyl, heptyl, and octyl, which may be straight or branched hydrocarbon chains. In some embodiments, the organometallic compound has a substituted or unsubstituted allyl ligand. In some embodiments, the allyl ligand is unsubstituted.

In some embodiments an organometallic cobalt compound with the following structure is used:

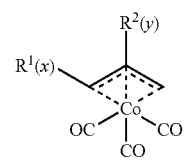

I where $R^1$ is $C_1$-$C_8$-alkyl, $R^2$ is $C_1$-$C_8$ alkyl, x is zero, 1 or 2; and y is zero or 1.

In some embodiments $R^1$ is a $C_2$-$C_8$-alkyl, $R^2$ is independently $C_2$-$C_8$ alkyl.

The term "alkyl" as used herein refers to saturated hydrocarbon chain of 1 to 8 atoms in length, such as methyl, ethyl, propyl, butyl, pentyl, hexyl, heptyl, and octyl. The term "alkyl" includes both straight and branched hydrocarbon chains. Thus, the term propyl includes both n-propyl and isopropyl. The term butyl includes both n-butyl, sec-butyl, iso-butyl, and tert-butyl.

In some embodiments x is 0 and y is 1. An example of an organometallic compound in accordance with this embodiment is shown below:

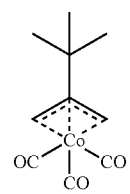

II

Certain described compounds are available from SAFC-Hitech of Haverhill, Mass., in conjunction with corresponding deposition apparatuses available from Lam Research Inc., of Fremont, Calif.

In some embodiments, cobalt-containing precursors include metal-organic precursors having a high vapor pressure at low temperatures, such as at temperatures less than about 100° C. An example vapor pressure may be about 0.5 Torr in an about 30° C. environment.

According to various embodiments, the Co deposition process may be performed according to U.S. Patent Publication No. 20160056077, incorporated by reference herein. Co fill may also be performed by sputtering from a Co target or by electroplating.

In some embodiments, the substrate may be annealed after formation of a thin seed layer of Co, after Co fill, or both. Annealing the substrate can lower Co resistivity and, at high temperatures, aid in formation of an alloy (or other compound formation) of Co and Mn. In some embodiments, annealing may be performed at a temperature between about 250° C. and about 500° C. To form an alloy of Co and Mn, higher temperatures may be employed, e.g., around 600° C. In some embodiments, temperatures lower than an alloying temperature may be used to react Mn and Co. The duration of the anneal may depend on the type of heating method used to heat the substrate. Example techniques include radiation heating, laser heating, thermal heating, and electromagnetic radiation heating. In some embodiments, annealing may be performed such that the annealing time is performed as quickly as possible. In some embodiments, heating may be performed for a duration between 1 second and 30 minutes.

In some embodiments, a manganese nitride (MnN, which may include any appropriate stoichiometric ratio including $Mn_3N_2$) may be formed in operation 104 of FIG. 1. Manganese nitride may be used, for example, if subsequent operations involve exposure to air. Exposure to air can lead to fast oxidation of an as-deposited pure Mn film, preventing formation of manganese silicate. By forming a MnN layer, oxidation can be prevented. An anneal to form the manganese silicate will desorb the nitrogen from the surface. MnN may be formed using a Mn-containing precursor and a nitrogen-containing reactant, such as ammonia ($NH_3$) in an ALD or CVDprocess as part of operation 104. Alternatively, ALD or CVD deposition of elemental Mn followed by anneal to form a layer of manganese silicate may be performed under vacuum without air exposure. The substrate may then be transferred under vacuum for cobalt fill. A description of depositing MnN on $SiO_2$ and then forming a silicate barrier by annealing is in Au, Yeung, Youbo Lin, and Roy G. Gordon. 2011. *Filling narrow trenches by iodine-catalyzed CVD of copper and manganese on manganese nitride barrier/adhesion layers*. Journal of the Electrochemical Society 158(5): D248-D253, incorporated by reference herein.

According to various embodiments, the methods may be used for logic interconnect (MOL and BEOL), metal gate applications, and other applications involving Co metallization. The methods described above with respect to FIG. 1 that incorporate Mn into Co metallization schemes (e.g. source/drain contact fill or local interconnect) address various integration challenges presented by the use of Co for enhancement of device performance.

The challenges include the following 1) Co can be easily oxidized due to its unique redox properties; 2) Co does not adhere well to dielectric surfaces (e.g., $SiO_2$ and $Si_3N_4$) and to oxidized metal substrates; 3) Co can diffuse into certain dielectrics and induce time-dependent dielectric breakdown (TDDB) issues on the semiconductor device; 4) For resistivity reduction, the Co film may be annealed to about 400° C. post deposition. Co undergoes phase transformation during anneal which leads to the development of a large stress hysteresis within the film. The latter can cause film delamination if adhesion to the substrate is not adequate; and 5) High temperature cycling similar to that of post deposition anneal is repeated in subsequent metallization/isolation sequences during device fabrication and may cause reliability issues with the Co film.

The use of a thin Mn layer (less than 20 Å, and in some cases, less than 10 Å) as a barrier and adhesion layer overcome these integration hurdles. First, because Co and Mn form different alloys, in some embodiments, Co adheres better to Mn than to other possible liner metals. Moreover, Mn has unique self-forming barrier property by virtue of its reactivity with different types of silicon dioxide. As such, it provides a thin barrier and adhesion layer for Co on $SiO_2$ substrates. As such, most of the electron conduction occurs through the lower resistance Co metal.

In some embodiments, the Mn-containing film is treated by exposure to N species, which may be provided in the form of a plasma. Mn reacts with active N species (N radicals or N ions) to form MnN which behaves differently than Mn for the nucleation and growth of Co. With the use of either direct or remote $N_2$ plasma, for example, treat the surface of the Mn-containing layer can be differentially treated (e.g., the top of the feature may be treated preferential to lower in the feature) to selectively inhibit the growth of Co. This can facilitate a bottom-up growth approach for a void free fill of a high aspect ratio structure typically encountered in advanced logic (e.g. source/drain contact and metal gate) or memory (3D NAND word line) applications. The reactive N treatment can be done with an $N_2$ plasma. An alternative way of N incorporation into the Mn film is with the use of $NH_3$ with or without plasma after the Mn film is formed.

In some embodiments the Mn surfaces at and near the top of the feature are treated by exposing to a plasma generated from a nitrogen-containing gas. This treatment may be referred to as "inhibitor controlled exposure" (ICE) or "plasma-based surface nitridation." In some embodiments, a remote plasma is used to generate the plasma. In various embodiments, the plasma is a directional plasma such that the active species from the plasma directly contact the surfaces of the feature in a direction perpendicular to the plane of the substrate. In some embodiments, treated surfaces may form $MnN_x$, which triggers a long nucleation delay in the subsequent deposition of the Co seed or Co bulk fill on the Mn-containing film. Some $MnN_x$ are not stable, allowing nitrided Mn-containing films to be a temporary inhibitor of Co nucleation.

Since various features may have an opening narrower than the width of the bottom of the feature, in some embodiments, the plasma treats mostly the top surfaces of the feature and the top about 10% to about 50% of the feature sidewalls. In some embodiments, the plasma treats the top about 10% to about 30% of the feature sidewalls. In various embodiments involving a small feature, due to the narrow opening, the bottom about 50% to 90% of the sidewalls remains untreated. In some embodiments, the bottom about 70% to 90% of the sidewalls remains untreated. In some embodiments, when the active species hits the feature opening, nitrogen ions collide around the opening, leaving a small gradient of treated Mn surfaces near the top of the feature. Since treated surfaces exhibit a longer nucleation delay, cobalt nucleation is selectively inhibited on the treated surfaces such that there is a differential inhibition profile along a feature axis formed by the treatment. Selective inhibition, which may also be referred to as selective passivation, differential inhibition, or differential passivation, involves inhibiting subsequent cobalt nucleation on a portion of the feature, while not inhibiting nucleation (or inhibiting nucleation to a lesser extent) on the remainder of the feature. For example, in some embodiments, a feature is selectively inhibited at or near a feature opening (e.g., the top about 10% to about 50%, or about 10% to about 30% of the feature sidewalls and the top surfaces of the feature), while nucleation in the bottom about 70% to 90%, or about 50% to 90% of the sidewalls inside the feature is not inhibited.

A directional plasma may generate ions, neutral species, and radicals among other species that form the differential inhibition profile. For a directional plasma, ions generated may be the dominant species in the inhibition process.

In some embodiments, a remote plasma may be used. A remote plasma may generate ions in addition to neutral species and radicals as well as other species. However, as compared to a directional in-situ plasma, a remote plasma may generate little to no ions, and the dominant species in the inhibition process may be radicals, rather than ions. In various embodiments, a remote plasma may be more gentle such that damage to components of the substrate is reduced (e.g., there is little bombardment of plasma species onto the substrate). This may be used in particular when fabricating logic devices, which may be more susceptible to performance issues if damaged by an in-situ or directional plasma. Damage caused by plasma may reduce functionality of the device. For example, for fabrication of a transistor, plasma damage to components of the transistor, such as in the metal gate area, may result in a voltage shift or electrical inefficiency.

Where a remote plasma is used, the substrate temperature may be set to a temperature between about 30° C. and about 450° C. In various embodiments, the chamber pressure may be set at a pressure between about 0.001 Torr and about 10 Torr. The RF power may be between about 50 W and 10000 W. In various embodiments, a nitrogen-containing gas is flowed to the remote plasma generator to generate a nitrogen-based plasma. The nitrogen-containing gas may be any of those described above. In some embodiments, the nitrogen-containing gas is nitrogen ($N_2$). The nitrogen flow rate may be between about 5 sccm and about 10000 sccm. The substrate may be exposed to a nitrogen-based plasma generated from a remote plasma generator for a duration between about 1 second and about 200 seconds.

EXPERIMENTAL

About 30 Å MnN was deposited onto a thermal SiO2 substrate using a CVD approach at temperature of greater than 250° C. A silicate was formed by anneal. A degas was performed at 300° C. The sample was transferred to an external plasma treatment chamber in which any $MnO_x$ formed during air exposure was reduced by a remote $H_2$ plasma. The sample was then transferred in a vacuum to a Co deposition chamber where about 90 Å Co was deposited onto the Mn surface by PVD. The final sample was then transferred in vacuum to a anneal chamber where it was annealed in an $H_2$/He ambient at 400° C. for 10 min. A second sample was also prepared with no post Co deposition anneal as a reference. A third sample was prepared with no degas, no $H_2$ reduction plasma and no anneal.

XPS profiling analysis was performed to examine the interfaces of Co/Mn/$SiO_2$.

Figure 3:
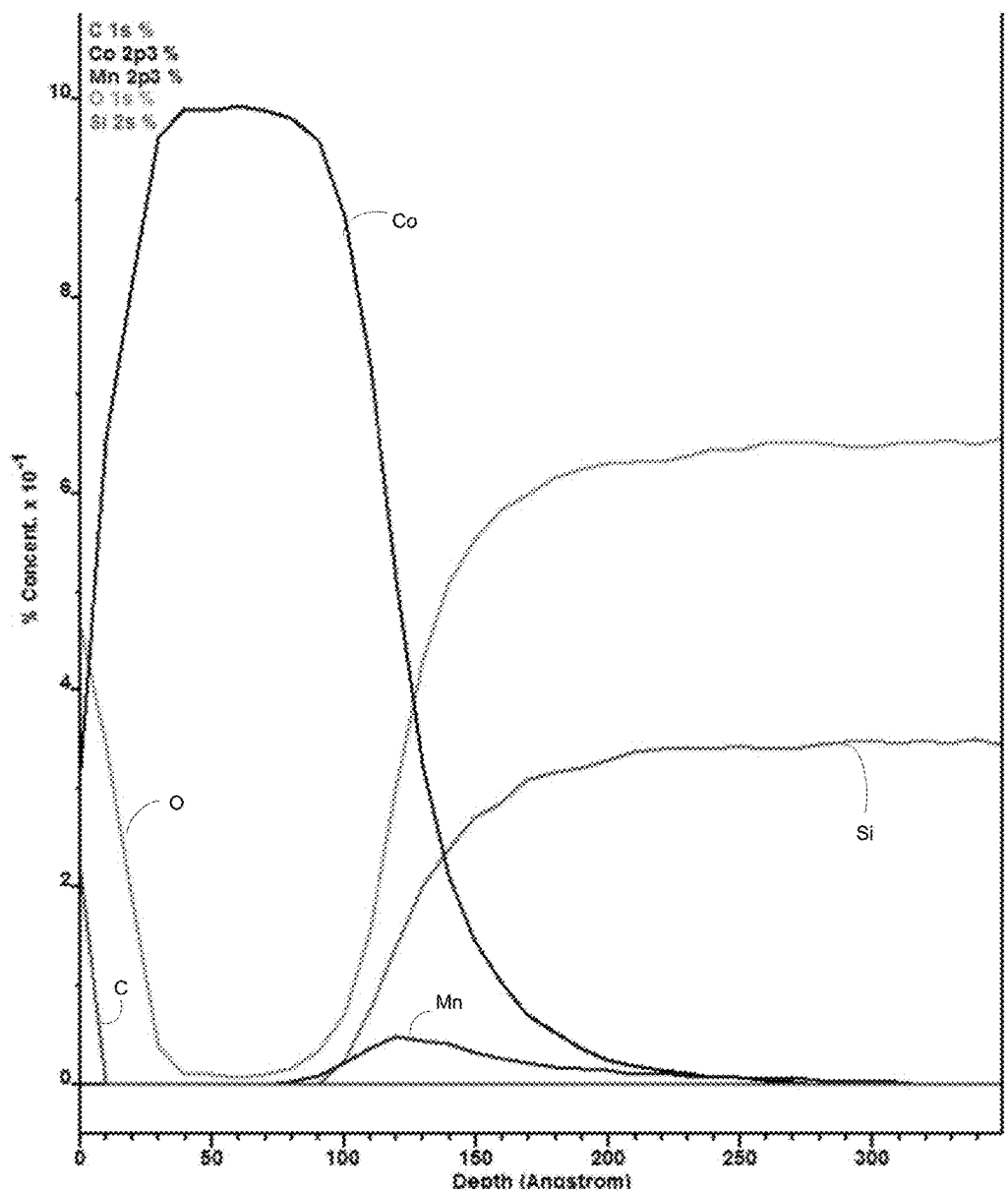
FIGS. 3-5 show XPS profiling of Mn/Co metal stack on $SiO_2$.
Figure 4:
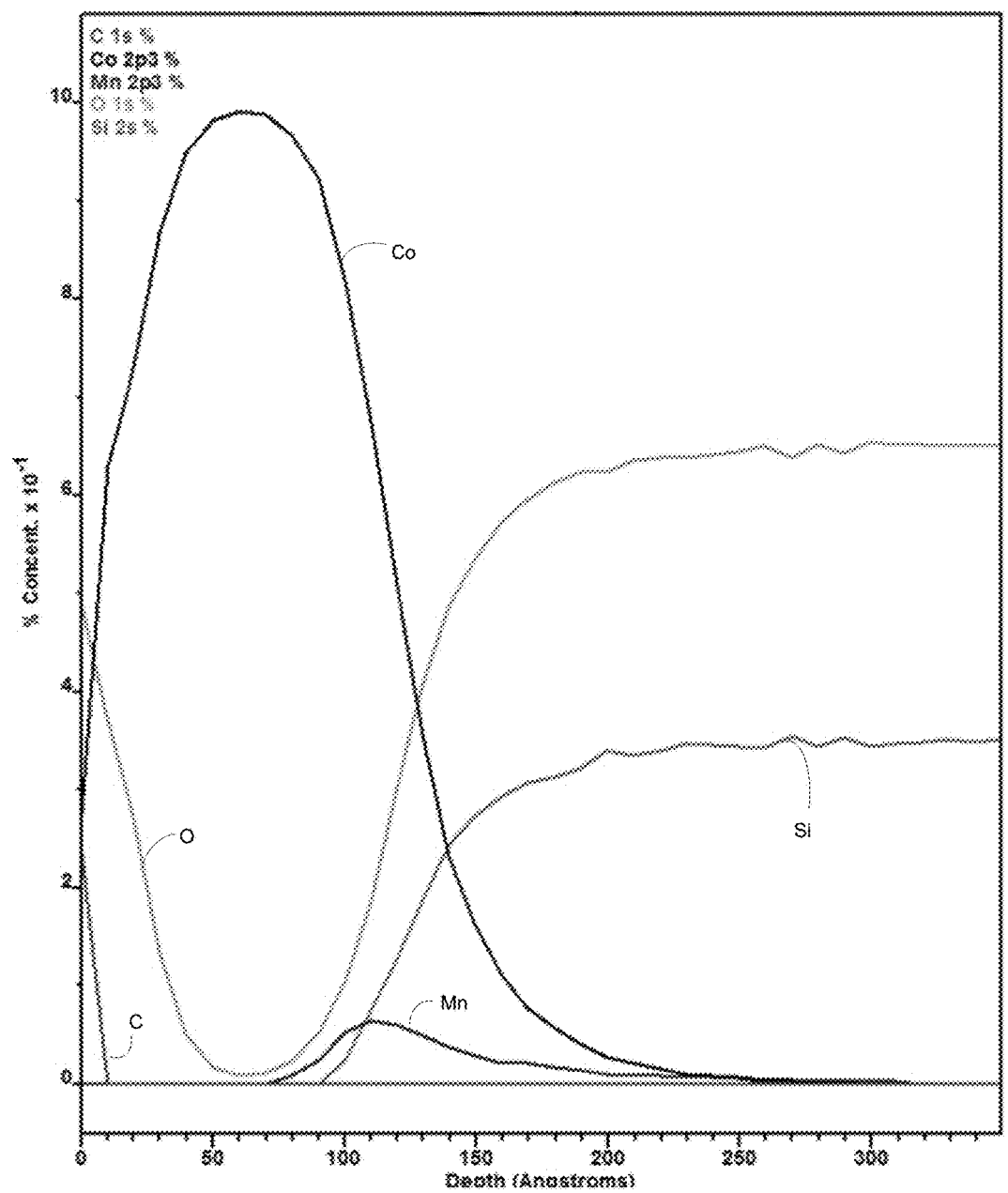
Figure 5:
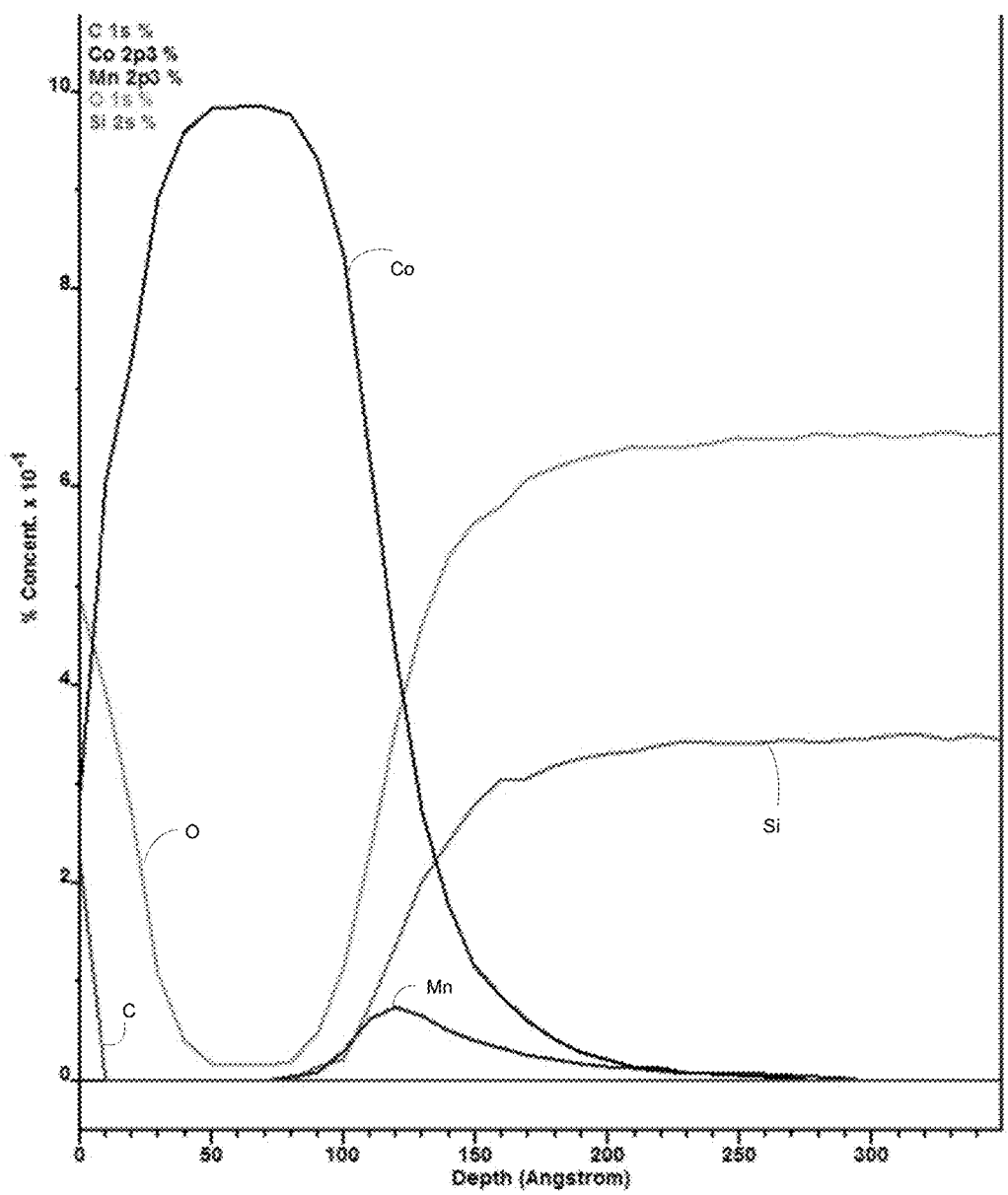

FIGS. 3-5 show XPS profiling of Mn/Co metal stack on $SiO_2$: FIG. 3 with anneal, FIG. 4 without anneal, and FIG. 5 without degas, $H_2$ plasma, or anneal. The results show that Mn reacts with $SiO_2$ to form a stable $MnSi_yO_z$ layer. There is little diffusion of Mn into the Co layer even after the 400° C. anneal, as evidenced by the overlapping of the Si and Mn signal at the top surface of the $MnSi_yO_z$ layer in FIG. 3. The profile is also similar to that of the as deposited sample in FIGS. 4 and 5, which have not seen any anneal. The layer is stable during degas and the $H_2$ plasma as well, as seen by comparing FIGS. 3 and 4 to FIG. 5.

Figure 6:
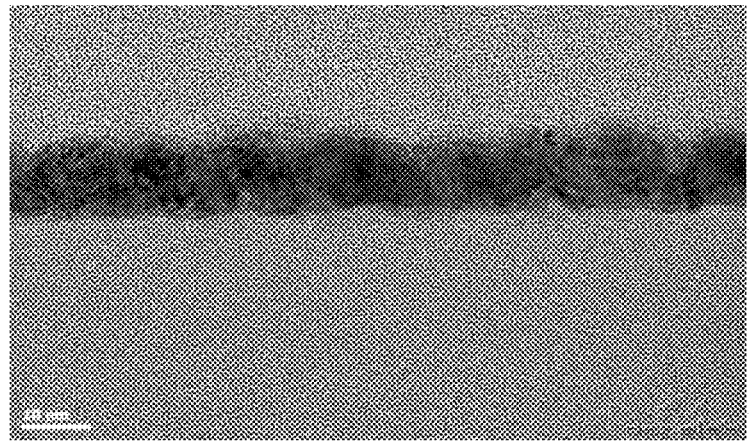
FIG. 6 shows an image of Co on a Mn-containing layer before anneal of the Co.
Figure 7:
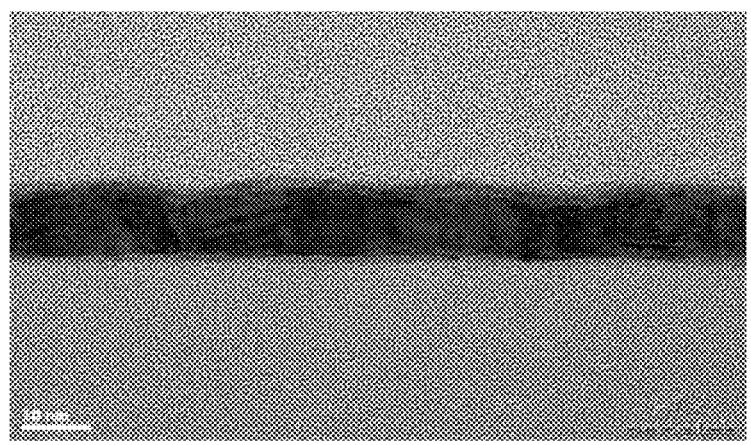
FIG. 7 shows an image of Co on a Mn-containing layer after anneal of the Co.

There is little or no penetration of Co into the $SiO_2$ beyond the bottom $MnSi_yO_z$ barrier layer for all samples. The results suggest Mn forms a good barrier on $SiO_2$ against Co diffusion. Additionally, there is no leaching and diffusion of Mn into the Co layer, suggesting the $MnSi_yO_z$ layer is stable at 400 C. This is significant because annealing Co allows grains to grow, densifying the film and lowering resistivity. FIG. 6 shows an image of Co on a Mn-containing layer before anneal and FIG. 7 shows an image of Co on the Mn-containing layer after anneal. The anneal densifies the film as can be seen by comparing the images.

Apparatus

Any suitable chamber may be used to implement disclosed embodiments. In some embodiments, a plasma may not be used during deposition of cobalt. Examples of deposition apparatuses include various systems, e.g., ALTUS and ALTUS Max, available from Lam Research Corporation of Fremont, Calif., or any of a variety of other commercially available processing systems.

Deposition techniques provided herein may also be implemented in a plasma enhanced chemical vapor deposition (PECVD) chamber or a conformal film deposition (CFD) chamber or in some embodiments, an ALD chamber. A suitable chamber may take many forms, and may be part of an apparatus that includes one or more chambers or reactors (sometimes including multiple stations) that may each house one or more substrate or wafers and may be configured to perform various substrate processing operations. The one or more chambers may maintain the substrate in a defined position or positions (with or without motion within that position, e.g., rotation, vibration, or other agitation). In one implementation, a substrate undergoing film deposition may be transferred from one station to another within a chamber during the process. In other implementations, the substrate may be transferred from chamber to chamber within the apparatus to perform different operations, such as etching operations or lithography operations. The full film deposition may occur entirely at a single station or any fraction of the total film thickness for any deposition step. While in process, each substrate may be held in place by a pedestal, substrate chuck, and/or other substrate-holding apparatus. For certain operations in which the substrate is to be heated, the apparatus may include a heater, such as a heating plate.

Figure 8A:
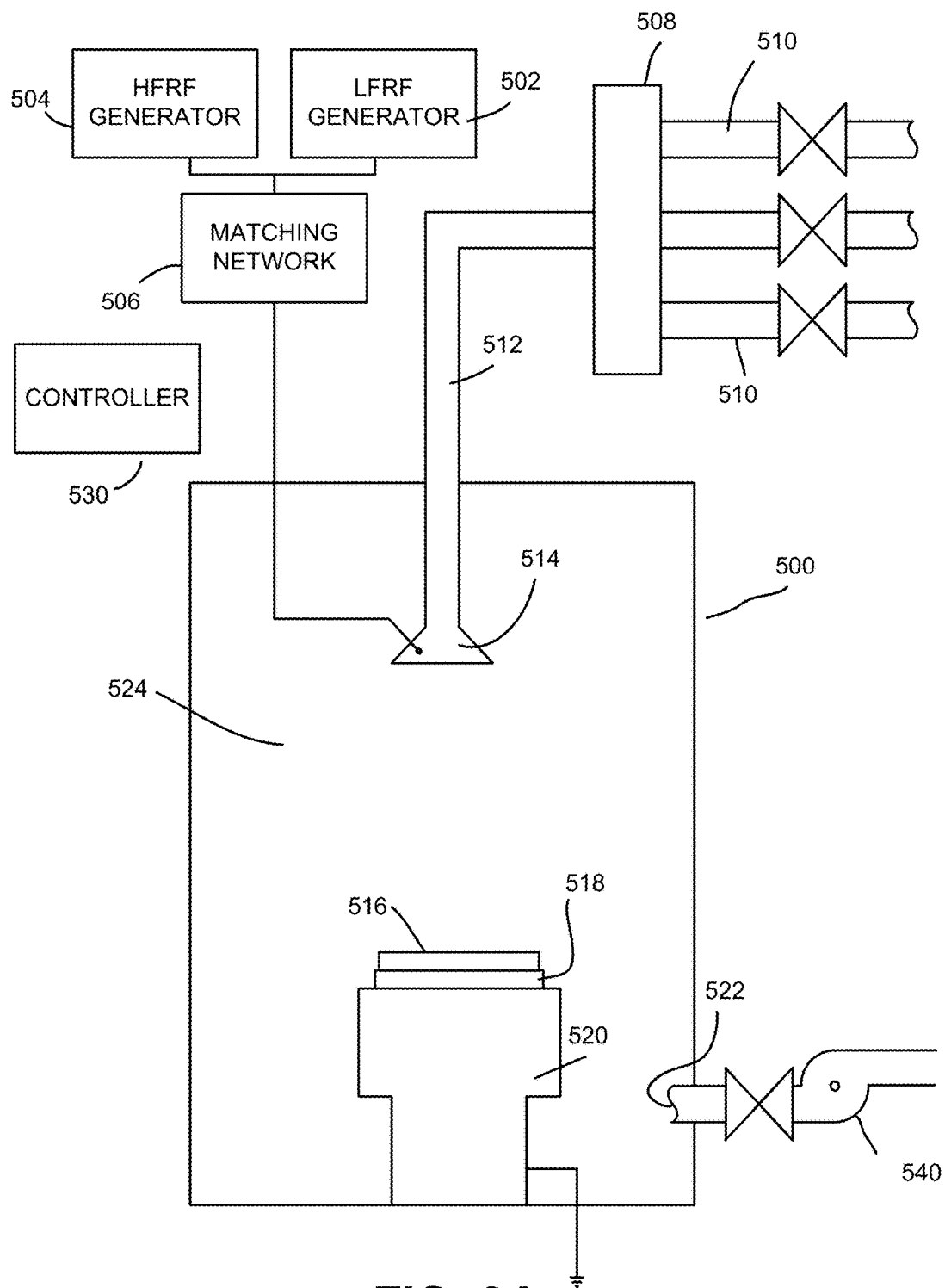
FIG. 8A provides a simple block diagram depicting various reactor components arranged for implementing certain methods described herein.

FIG. 8A provides a simple block diagram depicting various reactor components arranged for implementing some methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 100 W to 1000 W of power. In some examples, the matching network 506 may provide. In a typical process, the HFRF component may generally be between 1 MHz to 100 MHz, e.g., 13.56 MHz. In operations where there is an LF component, the LF component may be from less than about 1 MHz, e.g., 100 kHz.

Within the reactor, a pedestal 518 may support a substrate 516. The pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases, such as a Mn-containing precursor, a Co-containing precursor or a N-containing gas, may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

As discussed above, the techniques for deposition discussed herein may be implemented on a multi-station or single station tool. FIG. 6 is a schematic illustration of an example of such a tool. In specific implementations, a 300 mm Lam Vector™ tool having a 4-station deposition scheme or a 200 mm Sequel™ tool having a 6-station deposition scheme may be used. In some implementations, tools for processing 450 mm substrates may be used. In various implementations, the substrates may be indexed after every deposition and/or post-deposition plasma treatment, or may be indexed after etching steps if the etching chambers or stations are also part of the same tool, or multiple depositions and treatments may be conducted at a single station before indexing the substrate.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, substrate handling systems, etc., and configured to execute the instructions so that the apparatus will perform a technique in accordance with the disclosed embodiments, e.g., a technique such as that provided in the deposition steps of FIG. 1. Machine-readable media containing instructions for controlling process operations in accordance with the present disclosure may be coupled to the system controller 530. The controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, substrate movement, RF generator activation, etc., as well as instructions for controlling the mixture of gases, the chamber and/or station pressure, the chamber and/or station temperature, the substrate temperature, the target power levels, the RF power levels, the substrate pedestal, chuck, and/or susceptor position, and other parameters of a particular process performed by the reactor apparatus 500. For example, the software may include instructions or code for controlling the flow rate of a Mn-containing precursor, Co-containing precursor, the flow rate of a reducing agent, the flow rate of a nitrogen-containing gas, and exposure times for each of the above described flow chemistries. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

Figure 8B:
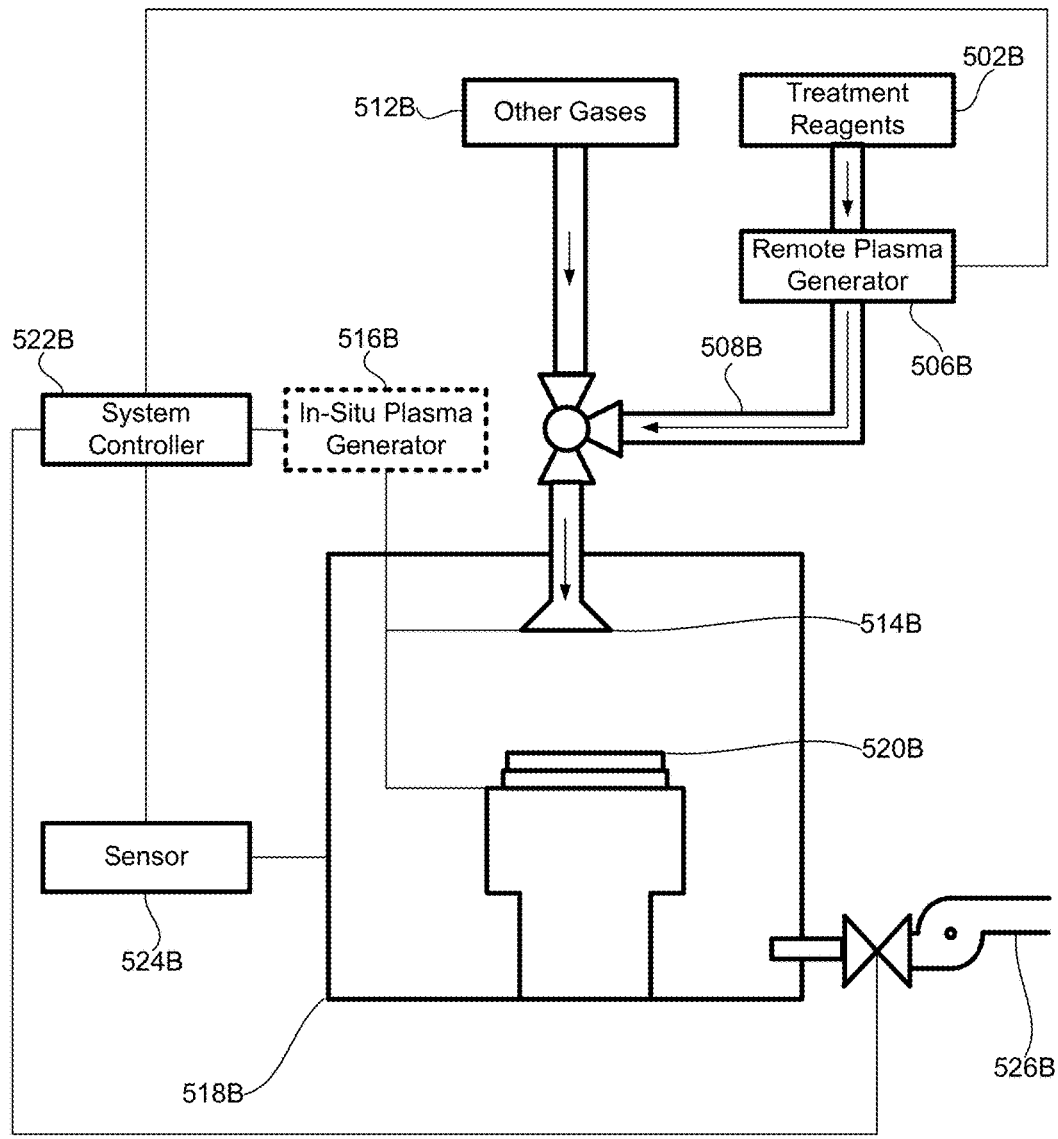
FIG. 8B illustrates a schematic representation of an apparatus for processing a semiconductor substrate in accordance with certain embodiments.

FIG. 8B illustrates a schematic representation of an apparatus 500B for processing a semiconductor substrate in accordance with certain embodiments. The apparatus 500B includes a chamber 518B with a pedestal 520B, a shower head 514B, and an optional in-situ plasma generator 516B. The apparatus 500B also includes a system controller 522B to receive input and/or supply control signals to various devices. The apparatus also includes 512B other gases that may be delivered to the chamber via showerhead 514B.

The nitrogen-containing gas and, in certain embodiments, inert gases, such as argon, helium and others, are supplied to the remote plasma generator 506B from a source 502B, which may be a storage tank. Any suitable remote plasma generator may be used for activating the nitrogen-containing gas before introducing it into the chamber 518B. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied nitrogen-containing gas. Imbedded into the RPC unit a high power RF generator provides energy to the electrons in the plasma. This energy is then transferred to the neutral etchant molecules leading to temperature in the order of 2000K causing thermal dissociation of these molecules. An RPC unit may dissociate more than 60% of incoming molecules because of its high RF energy and special channel geometry causing the molecules to adsorb most of this energy. In various embodiments, the remote plasma generator may generate a plasma using a radio frequency (RF) plasma power between about 50 W and about 10000 W.

In certain embodiments, a nitrogen-based plasma is flown from the remote plasma generator 506B through a connecting line 508B into the chamber 518B, where the mixture is distributed through the showerhead 514B. In other embodiments, a nitrogen-based plasma is flown into the chamber 518B directly completely bypassing the remote plasma generator 506 (e.g., the system 500B does not include such generator). Alternatively, the remote plasma generator 506B may be turned off while flowing the nitrogen-based plasma into the chamber 518B, for example, because activation of the etchant is not needed.

In some embodiments, the showerhead 514B or the pedestal 520B typically may have an internal plasma generator 516B attached to it. In one example, the generator 516B is a High Frequency (HF) generator capable of providing between about 0 W and 10,000 W at frequencies between about 1 MHz and 100 MHz. In a more specific embodiment, the HF generator may deliver between about 0 W to 5,000 W at about 13.56 MHz. The RF generator 516B may generate in-situ plasma to enhance removal of the initial tungsten layer. In certain embodiments, the RF generator 516B is not used during the removal operations of the process.

The chamber 518B may include a sensor 524B for sensing various process parameters, such as degree of deposition and etching, concentrations, pressure, temperature, and others. The sensor 524B may provide information on chamber conditions during the process to the system controller 522B. Examples of the sensor 524B include mass flow controllers, pressure sensors, thermocouples, and others. The sensor 524B may also include an infra-red detector or optical detector to monitor presence of gases in the chamber and control measures.

Deposition and selective removal operations generate various volatile species that are evacuated from the chamber 518B. Moreover, processing is performed at certain predetermined pressure levels the chamber 518B. For example, in some embodiments, the chamber pressure may be set at a pressure between about 0.001 Torr and about 10 Torr. Both of these functions may be achieved using a vacuum outlet 526B, which may be a vacuum pump.

Mn-containing precursors or cobalt-containing precursors, as well as treatment chemistry may enter the chamber from showerhead 514B such that a substrate on pedestal 520B is exposed to the precursor or treatment chemistry during various embodiments.

In certain embodiments, a system controller 522B may include any of the features and functions of system controller 530 described above with respect to FIG. 8A or any of the features and functions of control 650 described below with respect to FIG. 9.

As described above, one or more process stations may be included in a multi-station processing tool. FIG. 9 shows a schematic view of an embodiment of a multi-station processing tool 600 with an inbound load lock 602 and an outbound load lock 604, either or both of which may comprise a remote plasma source. A robot 606, at atmospheric pressure, is configured to move substrates from a cassette loaded through a pod 608 into inbound load lock 602 via an atmospheric port 610. A substrate is placed by the robot 606 on a pedestal 612 in the inbound load lock 602, the atmospheric port 610 is closed, and the load lock is pumped down. Where the inbound load lock 602 comprises a remote plasma source, the substrate may be exposed to a remote plasma treatment in the load lock prior to being introduced into a processing chamber 614. Further, the substrate also may be heated in the inbound load lock 602 as well, for example, to remove moisture and adsorbed gases. Next, a chamber transport port 616 to processing chamber 614 is opened, and another robot (not shown) places the substrate into the reactor on a pedestal of a first station shown in the reactor for processing. While the embodiment depicted in FIG. 9 includes load locks, it will be appreciated that, in some embodiments, direct entry of a substrate into a process station may be provided.

Figure 9:
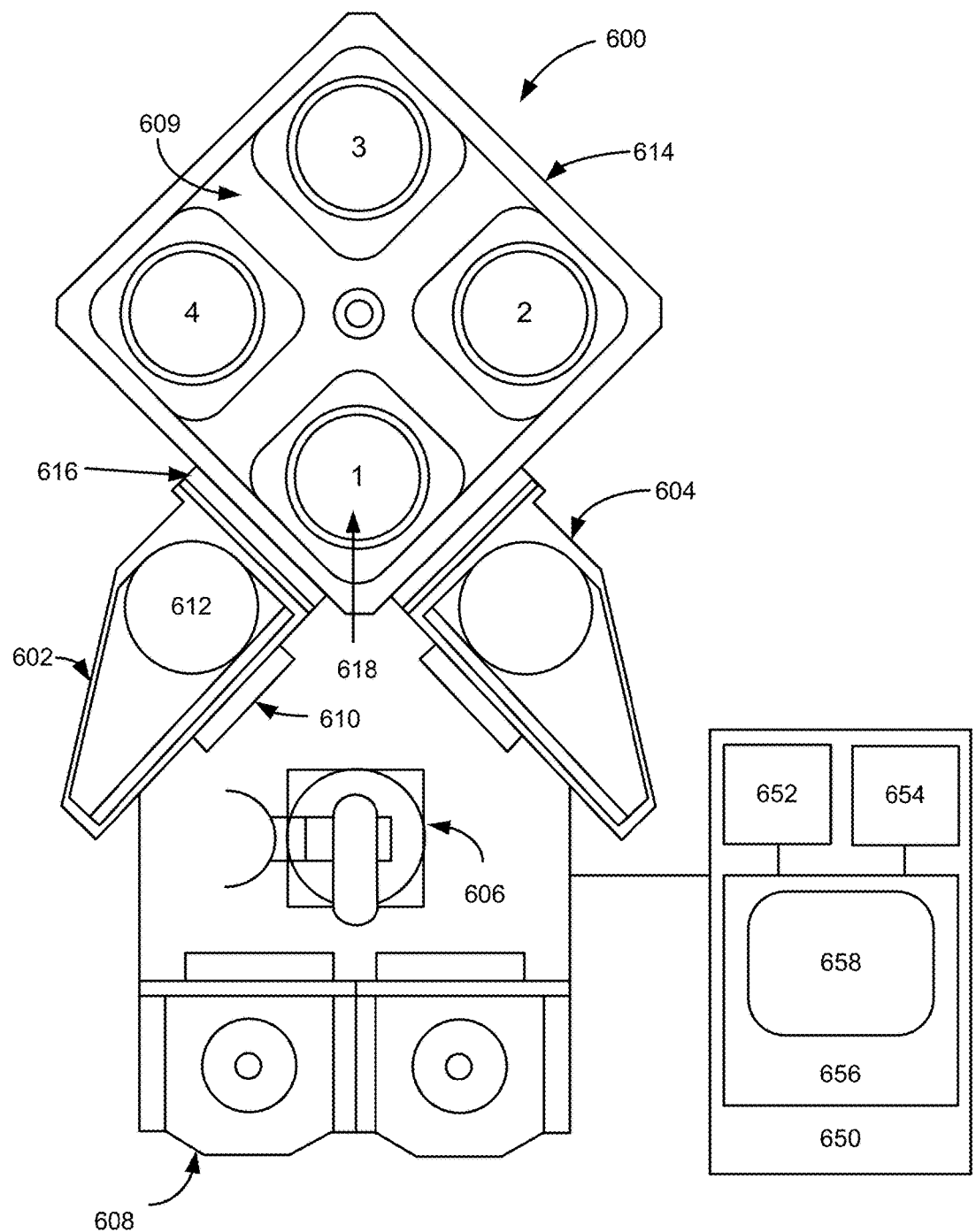
FIG. 9 shows a schematic view of an embodiment of a multi-station processing tool that may be used in accordance with certain embodiments.

The depicted processing chamber 614 comprises four process stations, numbered from 1 to 6 in the embodiment shown in FIG. 9. Each station has a heated pedestal (shown at 618 for station 1), and gas line inlets. Some stations may include similar components to those described above with respect to FIG. 8A. It will be appreciated that in some embodiments, each process station may have different or multiple purposes. For example, in some embodiments, a process station may be switchable between an ALD and CVD process mode. Additionally or alternatively, in some embodiments, processing chamber 614 may include one or more matched pairs of ALD and CVD process stations. In some embodiments, a Mn-containing film may be deposited in the features thermally (without a plasma) using ALD or CVD at one station (station 1). The substrate may then be transferred to a second station (such as station 2) within the same chamber 614, or to a station in a different chamber, where the substrate is exposed to a nitrogen-containing gas and plasma, followed by exposure to a cobalt-containing precursor and a reducing agent to deposit a Co seed layer by ALD bulk cobalt by CVD. In some embodiments, a reducing agent alternates with plasma exposure while a nitrogen-containing gas flows into the chamber. The nitrogen-containing gas and/or the reducing agent may be introduced only to the station where the substrate of interest is (such as station 2), or it may be introduced to the entire chamber 614.

In various embodiments, the substrate is not transferred to a second station. Rather, the substrate remains in the same station as during the thermal deposition (e.g., station 1), but the station is equipped to also introduce a reducing agent, a nitrogen-containing gas, and plasma to the station after the thermal deposition.

In some embodiments, after the substrate undergoes thermal deposition of Mn, the substrate is transferred to a different chamber, which may also include various stations. While the depicted processing chamber 614 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 9 depicts an embodiment of a wafer handling system 609 for transferring wafers within processing chamber 614. In some embodiments, wafer handling system 609 may transfer wafers between various process stations and/or between a process station and a load lock. It will be appreciated that any suitable wafer handling system may be employed. Non-limiting examples include wafer carousels and wafer handling robots. FIG. 9 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog, and/or digital input/output connections, stepper motor controller boards, etc.

In some embodiments, the controller 650 controls all of the activities of process tool 600. The controller 650 executes system control software 658 stored in mass storage device 654, loaded into memory device 656, and executed on processor 652. Alternatively, the control logic may be hard coded in the controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. Other computer software and/or programs stored on mass storage device 654 and/or memory device 656 associated with the controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition (e.g., cobalt-containing precursor, reducing agent, and nitrogen-containing gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

In some implementations, a controller 650 is part of a system, which may be part of the above-described examples. Such systems can comprise semiconductor processing equipment, including a processing tool or tools, chamber or chambers such as chamber 614, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 650, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 650 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 650 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer. For example, parameters may include cobalt-containing precursor gas flow, reducing agent gas flow, carrier gas flow, nitrogen-containing gas flow, plasma power and frequency, pedestal temperature, station or chamber pressure and/or temperature, and others.

The controller 650, in some implementations, may be a part of or coupled to a computer that is integrated with, coupled to the system, otherwise networked to the system, or a combination thereof. For example, the controller 650 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 650 receives instructions in the form of data, which specify parameters for each of the processing steps to be performed during one or more operations. It should be understood that the parameters may be specific to the type of process to be performed and the type of tool that the controller 650 is configured to interface with or control. Thus as described above, the controller 650 may be distributed, such as by comprising one or more discrete controllers that are networked together and working towards a common purpose, such as the processes and controls described herein. An example of a distributed controller 650 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 650 might communicate with one or more of other tool circuits or modules, other tool components, cluster tools such as tool 600, other tool interfaces, adjacent tools, neighboring tools, tools located throughout a factory, a main computer, another controller 650, or tools used in material transport that bring containers of wafers to and from tool locations and/or load ports in a semiconductor manufacturing factory.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with the controller 650. The user interface may include a display screen, graphical software displays of the apparatus and/or process conditions, and user input devices such as pointing devices, keyboards, touch screens, microphones, etc.

In some embodiments, parameters adjusted by the controller 650 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of the controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

The controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The controller will typically include one or more memory devices and one or more processors configured to execute the instructions so that the apparatus will perform a method in accordance with the present embodiments. Machine-readable media containing instructions for controlling process operations in accordance with the present embodiments may be coupled to the controller.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:
1. A method comprising:
   (a) providing a substrate having a feature comprising a feature opening;
   (b) forming a manganese nitride liner layer in the feature and heating the substrate to at least 350° C. to allow manganese to react with a silicon-containing underlayer to form a layer of manganese silicate and to desorb nitrogen from the substrate to form a $MnSi_yO_z$ layer wherein y and z are numbers greater than zero; and
   (c) after (b), exposing the substrate to a cobalt-containing precursor to at least partially fill the feature with cobalt.
2. The method of claim 1, wherein (c) comprises wholly filling the feature with cobalt.
3. The method of claim 2, further comprising heating the substrate to a temperature of at least 400° C. to anneal the cobalt.
4. The method of claim 3, further comprising reacting at least some manganese with cobalt during the heating of the substrate.
5. The method of claim 3, further comprising alloying at least some of the manganese with cobalt during the heating of the substrate.
6. The method of claim 1, wherein (b) comprises atomic layer deposition (ALD) or chemical vapor deposition (CVD) of the manganese nitride liner layer in the feature.
7. The method of claim 1, wherein (c) comprises depositing a cobalt seed layer for a subsequent Co plating process.
8. A method comprising:
   (a) providing a substrate having a feature comprising a feature opening; (b) forming a manganese-containing liner layer in the feature; and (c) after (b) exposing the substrate to a cobalt-containing precursor to at least partially fill the feature with cobalt and further comprising, after (b) and before (c), exposing the substrate to nitrogen species to form a differential inhibition profile in the feature.
9. The method of claim 8, further comprising preferentially depositing cobalt in the in the feature in accordance with the differential inhibition profile.
10. The method of claim 8, further comprising heating the substrate to a temperature of at least 400° C. to anneal the cobalt.
11. The method of claim 10, further comprising reacting at least some manganese with cobalt during the heating of the substrate.

12. The method of claim 10, further comprising alloying at least some of the manganese in the manganese-containing liner layer with cobalt during the heating of the substrate.

13. The method of claim 8, wherein (b) comprises deposition of an elemental manganese film in the feature.

* * * * *